United States Patent
Ko et al.

(10) Patent No.: US 9,590,068 B2
(45) Date of Patent: *Mar. 7, 2017

(54) HIGH-MOBILITY MULTIPLE-GATE TRANSISTOR WITH IMPROVED ON-TO-OFF CURRENT RATIO

(71) Applicant: Taiwan Semiconductor Manufacturing Company, Ltd., Hsin-Chu (TW)

(72) Inventors: Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 72 days.

This patent is subject to a terminal disclaimer.

(21) Appl. No.: 14/546,031

(22) Filed: Nov. 18, 2014

(65) Prior Publication Data

US 2015/0072495 A1 Mar. 12, 2015

Related U.S. Application Data

(63) Continuation of application No. 14/157,638, filed on Jan. 17, 2014, now Pat. No. 8,927,371, which is a
(Continued)

(51) Int. Cl.
H01L 29/66 (2006.01)
H01L 29/78 (2006.01)
H01L 29/812 (2006.01)

(52) U.S. Cl.
CPC .. H01L 29/66431 (2013.01); H01L 29/66484 (2013.01); H01L 29/66795 (2013.01);
(Continued)

(58) Field of Classification Search
CPC ............. H01L 29/66795; H01L 29/812; H01L 27/1087; H01L 27/0886; H01L 27/1211;
(Continued)

(56) References Cited

U.S. PATENT DOCUMENTS 5,055,890 A * 10/1991 Dawson ................ H01L 29/803
257/192
5,621,227 A 4/1997 Joshi
(Continued)

FOREIGN PATENT DOCUMENTS

AU 2003223306 A1 10/2003
CN 1289149 A 3/2001
(Continued)

OTHER PUBLICATIONS

Chuang, R.W. et al., •Gallium nitride metal-semiconductor-metal photodetectors prepared on silicon substrates,• Journal of Applied Physics, vol. 102, 2007, pp. 073110-1 • 073110-4.
(Continued)

*Primary Examiner* — Nathan W Ha
(74) *Attorney, Agent, or Firm* — Slater Matsil, LLP

(57) ABSTRACT

A multi-gate transistor includes a semiconductor fin over a substrate. The semiconductor fin includes a central fin formed of a first semiconductor material; and a semiconductor layer having a first portion and a second portion on opposite sidewalls of the central fin. The semiconductor layer includes a second semiconductor material different from the first semiconductor material. The multi-gate transistor further includes a gate electrode wrapping around sidewalls of the semiconductor fin; and a source region and a drain region on opposite ends of the semiconductor fin. Each of the central fin and the semiconductor layer extends from the source region to the drain region.

20 Claims, 10 Drawing Sheets

Related U.S. Application Data continuation of application No. 12/639,653, filed on Dec. 16, 2009, now Pat. No. 8,674,341.

(60) Provisional application No. 61/165,803, filed on Apr. 1, 2009.

(52) U.S. Cl.
CPC ...... *H01L 29/66818* (2013.01); *H01L 29/785* (2013.01); *H01L 29/7831* (2013.01); *H01L 29/812* (2013.01)

(58) Field of Classification Search
CPC ................ H01L 29/785; H01L 29/775; H01L 29/66431; H01L 29/66484
USPC .......................................... 257/192; 438/424
See application file for complete search history.

(56) References Cited

U.S. PATENT DOCUMENTS

| | | | |
|---|---|---|---|
| 6,121,153 | A | 9/2000 | Kikkawa |
| 6,218,685 | B1 | 4/2001 | Nogome |
| 6,399,970 | B2 | 6/2002 | Kubo et al. |
| 6,475,869 | B1 | 11/2002 | Yu |
| 6,475,890 | B1 | 11/2002 | Yu |
| 6,512,252 | B1 | 1/2003 | Takagi et al. |
| 6,635,909 | B2 | 10/2003 | Clark et al. |
| 6,654,604 | B2 * | 11/2003 | Yokogawa .......... H01L 21/8213 257/9 |
| 6,706,571 | B1 | 3/2004 | Yu et al. |
| 6,762,483 | B1 | 7/2004 | Krivokapic et al. |
| 6,858,478 | B2 | 2/2005 | Chau et al. |
| 6,867,433 | B2 | 3/2005 | Yeo et al. |
| 6,921,963 | B2 | 7/2005 | Krivokapic et al. |
| 6,960,781 | B2 | 11/2005 | Currie et al. |
| 7,042,009 | B2 | 5/2006 | Shaheen et al. |
| 7,045,401 | B2 | 5/2006 | Lee et al. |
| 7,056,781 | B2 | 6/2006 | Yoon et al. |
| 7,154,118 | B2 | 12/2006 | Lindert et al. |
| 7,190,050 | B2 | 3/2007 | King et al. |
| 7,205,615 | B2 | 4/2007 | Tsutsui et al. |
| 7,247,887 | B2 | 7/2007 | King et al. |
| 7,250,357 | B2 | 7/2007 | Senda et al. |
| 7,265,008 | B2 | 9/2007 | King et al. |
| 7,382,021 | B2 | 6/2008 | Faulkner et al. |
| 7,508,031 | B2 | 3/2009 | Liu et al. |
| 7,528,465 | B2 | 5/2009 | King et al. |
| 7,560,784 | B2 | 7/2009 | Cheng et al. |
| 7,598,134 | B2 | 10/2009 | Mouli |
| 7,605,449 | B2 | 10/2009 | Liu et al. |
| 7,670,894 | B2 | 3/2010 | Rachmady et al. |
| 7,683,436 | B2 | 3/2010 | Nishiyama et al. |
| 7,768,079 | B2 | 8/2010 | Sandford et al. |
| 7,807,523 | B2 | 10/2010 | Liu et al. |
| 7,863,674 | B2 | 1/2011 | Yeo et al. |
| 7,928,426 | B2 | 4/2011 | Chui et al. |
| 7,936,040 | B2 | 5/2011 | Wu |
| 7,939,862 | B2 | 5/2011 | Moroz et al. |
| 7,956,383 | B2 | 6/2011 | Kuroda et al. |
| 7,960,232 | B2 | 6/2011 | King et al. |
| 7,989,280 | B2 | 8/2011 | Brask et al. |
| 8,058,692 | B2 | 11/2011 | Lai et al. |
| 8,076,231 | B2 | 12/2011 | Saitoh et al. |
| 8,174,073 | B2 | 5/2012 | Lee et al. |
| 8,237,153 | B2 | 8/2012 | Chui et al. |
| 8,314,652 | B2 | 11/2012 | Kuo et al. |
| 8,357,927 | B2 | 1/2013 | Jang |
| 8,399,926 | B2 | 3/2013 | Saitoh et al. |
| 8,440,542 | B2 | 5/2013 | Sekar et al. |
| 8,575,596 | B2 | 11/2013 | Pillarisetty et al. |
| 2004/0104404 | A1 | 6/2004 | Bito |
| 2005/0029542 | A1 | 2/2005 | Mizutani |
| 2005/0093154 | A1 | 5/2005 | Kottantharayil et al. |
| 2005/0186742 | A1 | 8/2005 | Oh et al. |
| 2005/0205934 | A1 | 9/2005 | Lochtefeld et al. |
| 2006/0057856 | A1 | 3/2006 | Senda et al. |
| 2006/0076625 | A1 | 4/2006 | Lee et al. |
| 2006/0148182 | A1 | 7/2006 | Datta et al. |
| 2006/0292719 | A1 | 12/2006 | Lochtefeld et al. |
| 2007/0120156 | A1 | 5/2007 | Liu et al. |
| 2007/0238281 | A1 | 10/2007 | Hudait et al. |
| 2007/0243703 | A1 | 10/2007 | Pinnington et al. |
| 2008/0105899 | A1 | 5/2008 | Kim et al. |
| 2008/0135879 | A1 | 6/2008 | Shin et al. |
| 2008/0169485 | A1 | 7/2008 | Heyns et al. |
| 2008/0237655 | A1 | 10/2008 | Nakabayashi et al. |
| 2008/0258176 | A1 | 10/2008 | Chou et al. |
| 2008/0290470 | A1 | 11/2008 | King et al. |
| 2008/0315310 | A1 | 12/2008 | Rachmady et al. |
| 2009/0001415 | A1 | 1/2009 | Lindert et al. |
| 2009/0194790 | A1 | 8/2009 | Sato et al. |
| 2009/0267113 | A1 | 10/2009 | Shimoida et al. |
| 2010/0252862 | A1 | 10/2010 | Ko et al. |
| 2010/0276668 | A1 | 11/2010 | Ko et al. |
| 2010/0301390 | A1 | 12/2010 | Ko et al. |
| 2010/0301392 | A1 | 12/2010 | Ko et al. |
| 2012/0001239 | A1 | 1/2012 | Ko et al. |
| 2013/0248929 | A1 | 9/2013 | Ko et al. |
| 2014/0070276 | A1 | 3/2014 | Ko et al. |

FOREIGN PATENT DOCUMENTS

| | | |
|---|---|---|
| CN | 1574399 A | 2/2005 |
| CN | 102244503 A1 | 11/2011 |
| EP | 0921575 A2 | 6/1999 |
| EP | 1488462 A2 | 12/2004 |
| JP | 2005005633 A | 1/2005 |
| JP | 2005005646 A | 1/2005 |
| JP | 2005019970 A | 1/2005 |
| JP | 2005051241 A | 2/2005 |
| JP | 2005062219 A | 3/2005 |
| JP | 2005521258 A | 7/2005 |
| JP | 2006516820 A | 7/2006 |
| JP | 2006521026 A | 9/2006 |
| JP | 2008014104 | 1/2008 |
| JP | 2008141040 A | 1/2008 |
| JP | 2008508725 A | 3/2008 |
| JP | 2008160131 A | 7/2008 |
| JP | 2008270521 A | 11/2008 |
| JP | 2008546181 A | 12/2008 |
| JP | 2009105163 A | 5/2009 |
| KR | 20047012876 | 11/2004 |
| KR | 20070088817 A | 8/2007 |
| TW | 580771 B | 3/2004 |
| TW | I269358 | 12/2006 |
| WO | 03081640 A2 | 10/2003 |
| WO | 2007046150 A1 | 4/2007 |

OTHER PUBLICATIONS

Chui, C.O. et al., •Germanium n-type shallow junction activation dependences,• Applied Physics Letters, vol. 87, 2005, pp. 091901-1 • 091909-3.

Datta, S. et al., •Ultrahigh-Speed 0.5 V Supply Voltage In0.7Ga0.3As Quantum-Well Transistors on Silicon Substrate,• IEEE Electron Device Letters, vol. 28, No. 8, Aug. 2007, pp. 685-687.

Iwakami, S. et al., •AlGaN/GaN Heterostructure Field-Effect Transistors (HFETs) on Si Substrates for Large-Current Operation,• Japanese Journal of Applied Physics, vol. 43, No. 7A, 2004, pp. L831-L833.

Jackson, S.L. et al., •Silicon Doping of InP, GaAs, In0.53Ga0.47As and In0.49Ga0.51P Grown by Gas Source and Metalorganic Molecular Beam Epitaxy Using a SiBr4 Vapor Source,• IEEE, Conference Proceedings, Sixth International Conference on Indium Phosphide and Related Materials, Mar. 27-31, 1994, pp. 57-60.

Krishnamohan, T. et al., •High-Mobility Low Band-To-Band-Tunneling Strained-Germanium Double-Gate Heterostructure FETs: Simulations,• IEEE Transactions on Electron Devices, vol. 53, No. 5, May 2006, pp. 1000-1009.

Merriam-Webster OnLine definition of region. No Date.

(56) References Cited

OTHER PUBLICATIONS

Merriam-Webster OnLine definition of portion, 3 pages.

Posselt, M. et al., •P implantation into preamorphized germanium and subsequent annealing: Solid phase epitaxial regrowth, P diffusion, and activation,• Journal of Vacuum Science Technology, vol. 26, Jan./Feb. 2008, pp. 430-434.

Satta, A., •Diffusion, activation, and regrowth behavior of high dose P implants in Ge,• Applied Physics Letters, vol. 88, 2006, pp. 162118-1 • 162118-3.

Satta, A., •P implantation doping of Ge: Diffusion, activation, and recrystallization,• Journal of Vacuum Science Technology, vol. 24, Jan./Feb. 2006, pp. 494-498.

Shih, C.-F. et al., •Blue, Green, and White InGaN Light-Emitting Diodes Grown on Si,• Japanese Journal of Applied Physics, vol. 44, No. 4, 2005, pp. L140-L143.

Vanamu, G. et al., •Growth of high-quality GaAs on $Ge/Si_{1-x}Ge_x$ on nanostructured silicon substrates,• Applied Physics Letters, vol. 88, 2006, pp. 251909-1 • 251909-3.

Vurgaftman, I. et al., •Band parameters for III-V compound semiconductors and their alloys,• Journal of Applied Physics, vol. 89, No. 11, Jun. 1, 2001, pp. 5815-5875.

Yamane, Y. et al., •Selective Formation of Ohmic Contacts to n-GaAs,• IEEE, Electronics Letters, vol. 23, No. 8, Apr. 9, 1987, pp. 382-383.

\* cited by examiner

HIGH-MOBILITY MULTIPLE-GATE TRANSISTOR WITH IMPROVED ON-TO-OFF CURRENT RATIO

PRIORITY CLAIM AND CROSS-REFERENCE

This application is a continuation of U.S. patent application Ser. No. 14/157,638, entitled "High-Mobility Multiple-Gate Transistor with Improved On-to-Off Current Ratio," filed on Jan. 17, 2014 which is continuation of U.S. application Ser. No. 12/639,653, entitled "High-Mobility Multiple-Gate Transistor with Improved On-to-Off Current Ratio," filed on Dec. 16, 2009, now U.S. Pat. No. 8,674,341 which application claims the benefit of U.S. Provisional Application No. 61/165,803 filed on Apr. 1, 2009, entitled "High-Mobility Multiple-Gate Transistor with Improved On-to-Off Current Ratio," which application is hereby incorporated herein by reference.

TECHNICAL FIELD

This invention relates generally to integrated circuit devices, and more particularly to metal-oxide-semiconductor (MOS) transistors and methods for forming the same.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Germanium is a commonly known semiconductor material. The electron mobility and hole mobility of germanium are greater than that of silicon, which is the most commonly used semiconductor material in the formation of integrated circuits. Hence, germanium is an excellent material for forming integrated circuits. However, in the past, silicon gained more popularity over germanium since its oxide (silicon oxide) is readily usable in the gate dielectric of MOS transistors. The gate dielectrics of the MOS transistors can be conveniently formed by thermal oxidation of silicon substrates. The oxide of germanium, on the other hand, is soluble in water, and hence is not suitable for the formation of gate dielectrics.

With the use of high-k dielectric materials in the gate dielectrics of MOS transistors, however, the convenience provided by the silicon oxide is no longer a big advantage, and hence germanium is reexamined for use in integrated circuits.

In addition to germanium, compound semiconductor materials of group III and group V elements (referred to as III-V compound semiconductors hereinafter) are also good candidates for forming NMOS devices for their high electron mobility.

A challenge faced by the semiconductor industry is that although the MOS transistors formed on germanium and III-V compound semiconductors have high drive currents, the leakage currents of these MOS transistors are also high. This is partially caused by the low bandgap and the high dielectric constants of germanium and the III-V compound semiconductors. For example, FIG. 1 illustrates the comparison of bandgaps and dielectric constants of germanium and some commonly used III-V compound semiconductors, and some other semiconductor materials. FIG. 1 reveals that the bandgaps of germanium and some commonly used III-V compound semiconductors are small. Therefore, the respective MOS transistors suffer from band-to-band leakage currents between their gates and source/drain regions. The high dielectric constants of these materials further worsen the leakage currents. As a result, the on/off current ratios (Ion/Ioff) of these MOS transistors are relatively low.

SUMMARY OF THE INVENTION

In accordance with one aspect of the present invention, a multi-gate transistor includes a semiconductor fin over a substrate. The semiconductor fin includes a central fin formed of a first semiconductor material; and a semiconductor layer having a first portion and a second portion on opposite sidewalls of the central fin. The semiconductor layer includes a second semiconductor material different from the first semiconductor material. The multi-gate transistor further includes a gate electrode wrapping around sidewalls of the semiconductor fin; and a source region and a drain region on opposite ends of the semiconductor fin. Each of the central fin and the semiconductor layer extends from the source region to the drain region.

In accordance with another aspect of the present invention, a multi-gate transistor includes a substrate and a semiconductor fin over the substrate. The semiconductor fin includes a central fin formed of a first semiconductor material, and a semiconductor layer including a first portion and a second portion on opposite sidewalls of, and adjoining, the central fin. The central fin and the semiconductor layer form a quantum well. The multi-gate transistor further includes a gate dielectric having a first portion on an outer sidewall of the first portion of the semiconductor layer and a second portion on an outer sidewall of the second portion of the semiconductor layer; a gate electrode over the gate dielectric; and a source region and a drain region on opposite ends of, and adjoining, the central fin and the semiconductor layer. The source region and the drain region are n-type regions.

In accordance with yet another aspect of the present invention, a method of forming a multi-gate transistor includes forming a semiconductor fin, which further includes forming a central fin including a first semiconductor material; and forming a semiconductor layer including a first portion and a second portion on opposite sidewalls of the central fin. The semiconductor layer includes a second semiconductor material different from the first semiconductor material. The method further includes forming a gate electrode wrapping around sidewalls of the semiconductor fin; and forming a source region and a drain region on opposite ends of the semiconductor fin. Each of the central fin and the semiconductor layer extends from the source region to the drain region.

In accordance with yet another aspect of the present invention, a method of forming a multi-gate transistor includes providing a semiconductor substrate; forming insulation regions in the semiconductor substrate and adjacent to each other; recessing the insulation regions, so that a region between the insulation regions forms a central fin including a first semiconductor material; epitaxially growing a semiconductor layer including a first portion and a second portion on opposite sidewalls of the central fin, wherein the semiconductor layer includes a second semiconductor material different from the first semiconductor material; forming a gate electrode over a top surface and wrapping around sidewalls of the semiconductor fin; and forming a source region and a drain region on opposite ends of the semiconductor fin. Each of the central fin and the semiconductor layer extends from the source region to the drain region.

The advantageous features of the present invention include improved performance in MOS transistors including improved drive currents, reduced leakage currents, and high on-to-off current ratios.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Novel fin field-effect transistors (FinFETs) and the methods of forming the same are presented. The intermediate stages of manufacturing embodiments of the present invention are illustrated. The variations and the operation of the embodiments are discussed. Throughout the various views and illustrative embodiments of the present invention, like reference numbers are used to designate like elements.

Figure 1:
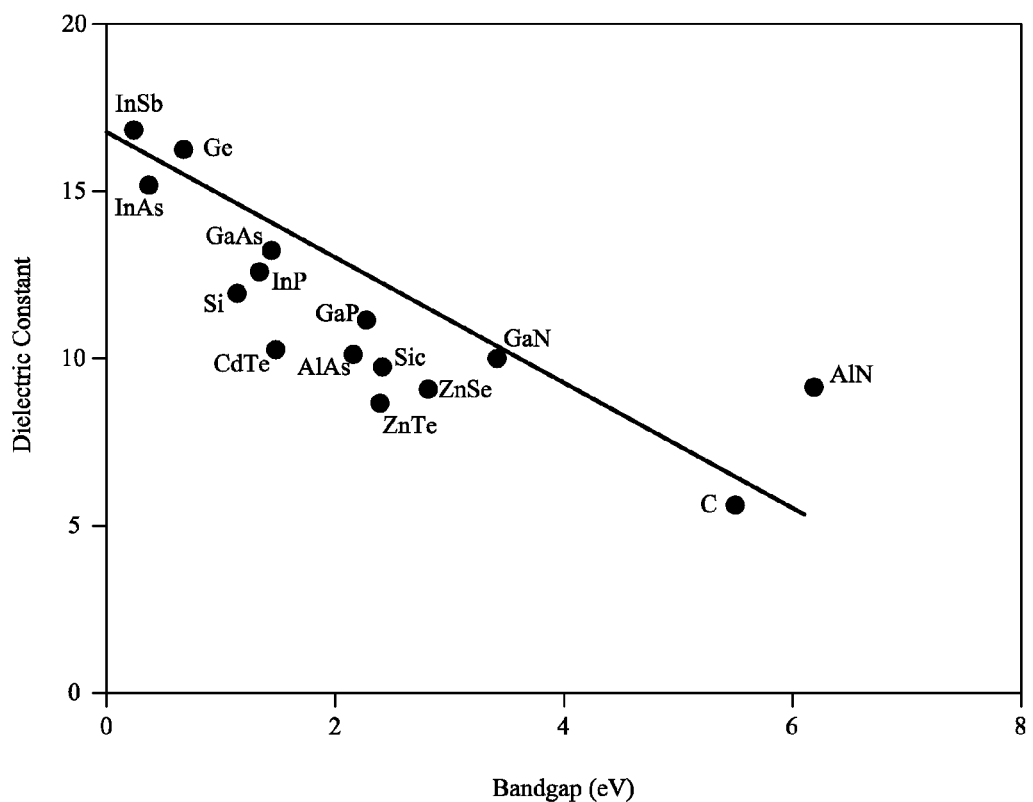
FIG. 1 illustrates bandgaps and dielectric constants of some semiconductor materials.
Figure 2:
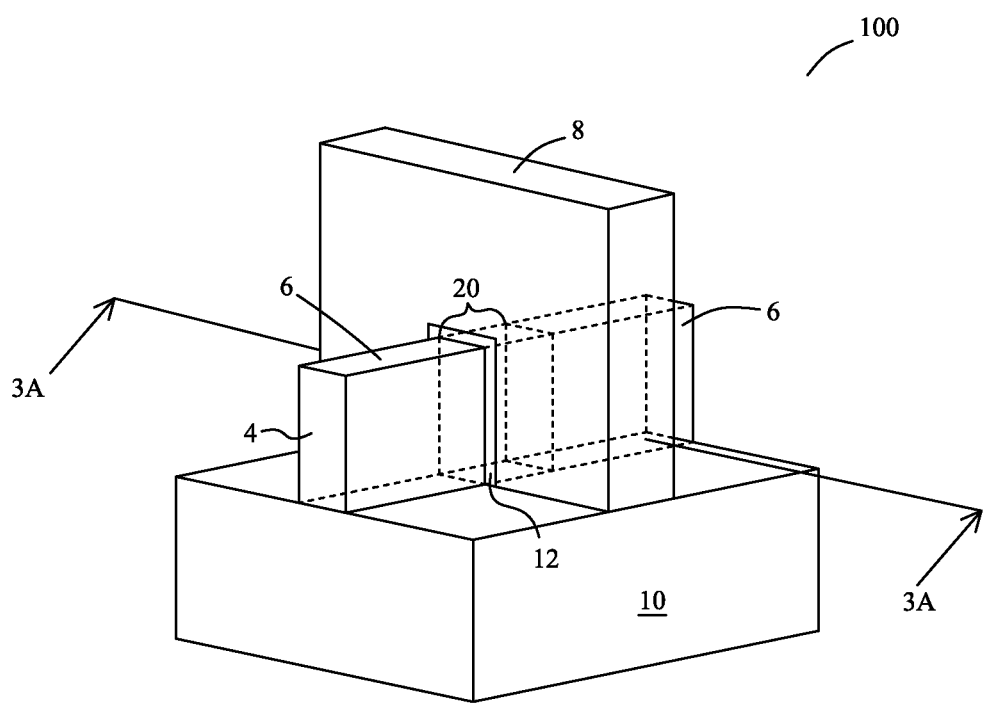
FIG. 2 illustrates a perspective view of an embodiment.

FIG. 2 illustrates a perspective view of FinFET 100 (which may be an n-type FinFET) formed on base material 10. Base material 10 may be formed of a dielectric material, for example, silicon oxide. Alternatively, base material 10 may be formed of a semiconductor material including, but not limited to, silicon, germanium, gallium arsenide, and the like. In yet other embodiments, base material 10 may include portions of a semiconductor substrate and isolation structures in the semiconductor substrate. FinFET 100 includes source region 4, drain region 6, and fin 20 therebetween. FinFET 100 may be an NFET, and hence source region 4 and drain region 6 are n-type regions doped with an n-type impurity, for example, by implantations. Gate dielectric 12 may be formed on the top and opposite sidewalls of fin 20. Gate electrode 8 is further formed on gate dielectric 12. In an embodiment, gate dielectric 12 may be omitted.

Figure 3A:
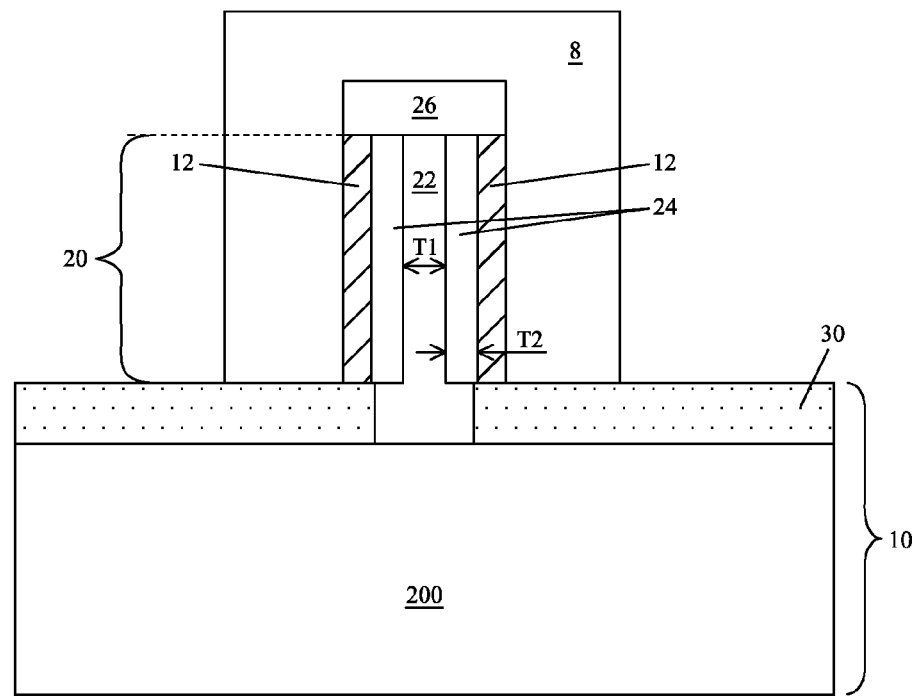
FIG. 3A illustrates a cross-sectional view of a double-gate fin field-effect transistor (FinFET)

The cross-sectional views that are shown in detail in subsequent paragraphs, unless specified otherwise, are made across a vertical plane crossing line 3A-3A in FIG. 2. FIG. 3A illustrates the cross-sectional view of a double-gate FinFET. Fin 20 comprises central fin 22 formed of a first semiconductor material. Fin 20 further comprises semiconductor layer(s) 24 that are formed of a second semiconductor material different from the first semiconductor material. Semiconductor layer(s) 24 are formed on opposite sidewalls of central fin 22. Gate dielectric 12 is formed on sidewalls of semiconductor layer(s) 24. Gate electrode 8 is formed on gate dielectric 12.

Gate dielectric 12 may be formed of commonly used dielectric material such as silicon oxide, silicon nitride, oxynitrides, multi-layers thereof, and combinations thereof. Gate dielectric 12 may also be formed of high-k dielectric materials. The exemplary high-k materials may have k values greater than about 4.0, or even greater than about 7.0, and may include aluminum-containing dielectrics such as $Al_2O_3$, HfAlO, HfAlON, AlZrO, Hf-containing materials such as $HfO_2$, $HfSiO_x$, $HfAlO_x$, $HfZrSiO_x$, HfSiON, and other materials such as $LaAlO_3$ and $ZrO_2$. Gate electrode 8 may be formed of doped polysilicon, metals, metal nitrides, metal silicides, and the like.

Figure 3B:
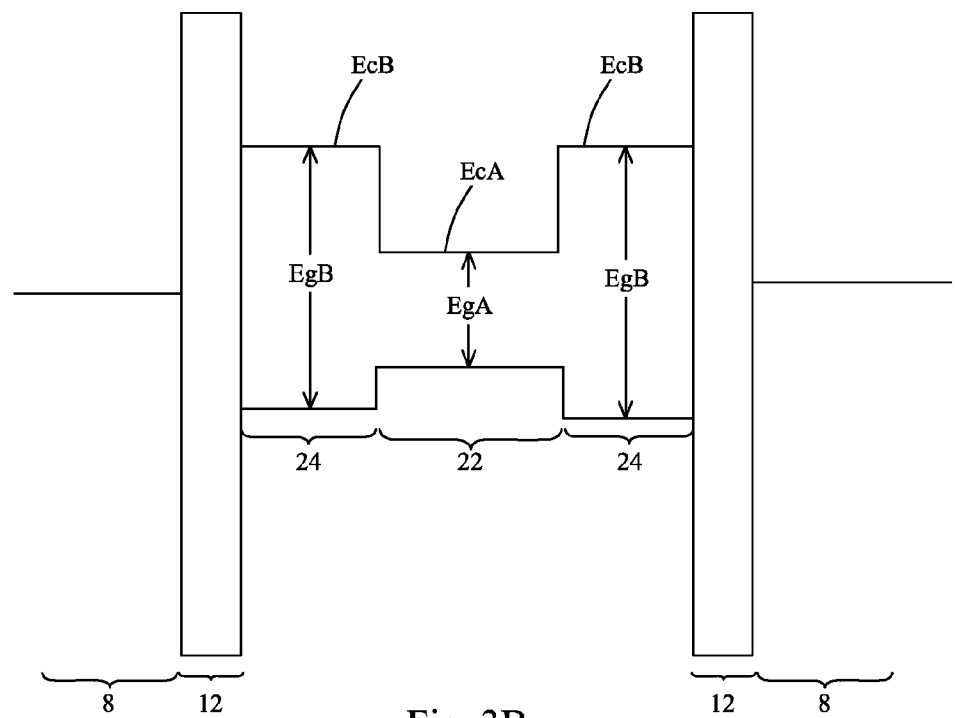
FIG. 3B illustrates a band diagram of the embodiment shown in FIG. 3A.

FIG. 3B illustrates a schematic band diagram of the double-gate FinFET as shown in FIG. 3A. In an embodiment, central fin 22 has bandgap EgA, while semiconductor layer(s) 24 have bandgap EgB greater than bandgap EgA. In an exemplary embodiment, bandgap EgA is lower than bandgap EgB by about 0.1 eV, although greater or lower bandgap differences may also apply. Conduction band EcA of central fin 22 may also be lower than conduction band EcB of semiconductor layer(s) 24. In an exemplary embodiment, conduction band EcA is lower than conduction band EcB by about 0.05 eV, although greater or lower conduction band differences may also apply. The appropriate materials of central fin 22 and semiconductor layer(s) 24 may be selected by comparing the bandgaps of the available semiconductor materials with high electron mobilities, which may include, but are not limited to, silicon, germanium, GaAs, InP, GaN, InGaAs, InAlAs, GaSb, AlSb, AlAs, AlP, GaP, and the like. In an exemplary embodiment, central fin 22 comprises InGaAs, while semiconductor layer(s) 24 comprise GaAs. In other embodiments, central fin 22 comprises InAs, while semiconductor layer(s) 24 comprise InAlAs.

Referring back to FIG. 3A, with bandgap EgA of central fin 22 being lower than bandgap EgB of semiconductor layer(s) 24, fin 20 (including central fin 22 and semiconductor layer(s) 24) forms a quantum well. When a non-zero gate voltage is applied to gate electrode 8, due to the quantum confinement effect, electrons tend to flow through the central portion of fin 20, that is, central fin 22. Accordingly, the carrier mobility is high because of the low bandgap EgA, and hence the on-current Ion of the respective FinFET 100 is high. On the other hand, when FinFET 100 is turned off with the gate voltage being zero volts, electrons tend to flow through the surface layers of fin 20, that is, semiconductor layer(s) 24. Accordingly, the carrier mobility is low due to the high bandgap EgB, and hence the off-current (leakage current) Ioff of the respective FinFET 100 is low. FinFET 100 thus has a high on/off current ratio.

To improve the performance of FinFET 100, the quantum well needs to be strengthened. Accordingly, thickness T1 of central semiconductor fin 20 is preferably small. In an exemplary embodiment, thickness T1 is less than about 50 nm, and may even be less than about 10 nm. Thickness T2 of semiconductor layer(s) 24 may be less than about 50 nm.

FIG. 3A further includes hard mask 26 on top of semiconductor fin 20, wherein hard mask 26 may be formed of commonly used dielectric materials such as silicon nitride, silicon oxide, silicon oxynitride, and the like. FinFET 100 as shown in FIG. 3A is a double-gate FinFET.

Figure 4:
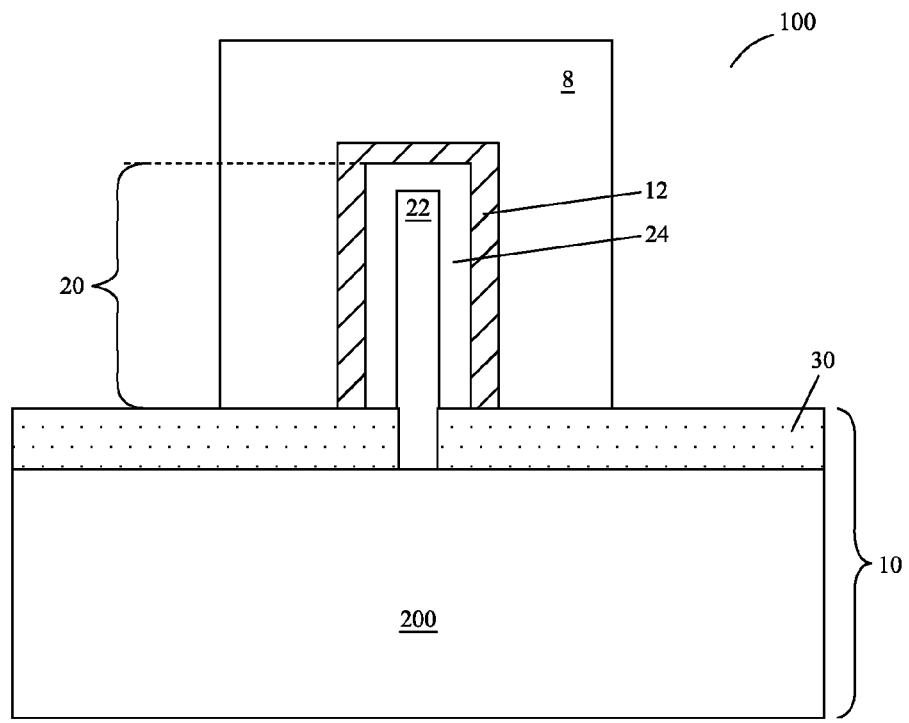
FIG. 4 illustrates a cross-sectional view of a tri-gate FinFET.

In alternative embodiments, as shown in FIG. 4, no hard mask is formed on top of fin 20. Instead, semiconductor layer(s) 24 on opposite sidewalls of central fin 22 are joined by a portion on top of central fin 22 to form a continuous layer. Gate dielectric 12 also forms a continuous layer. FinFET 100 as shown in FIG. 4 is a tri-gate FinFET.

Figure 5:
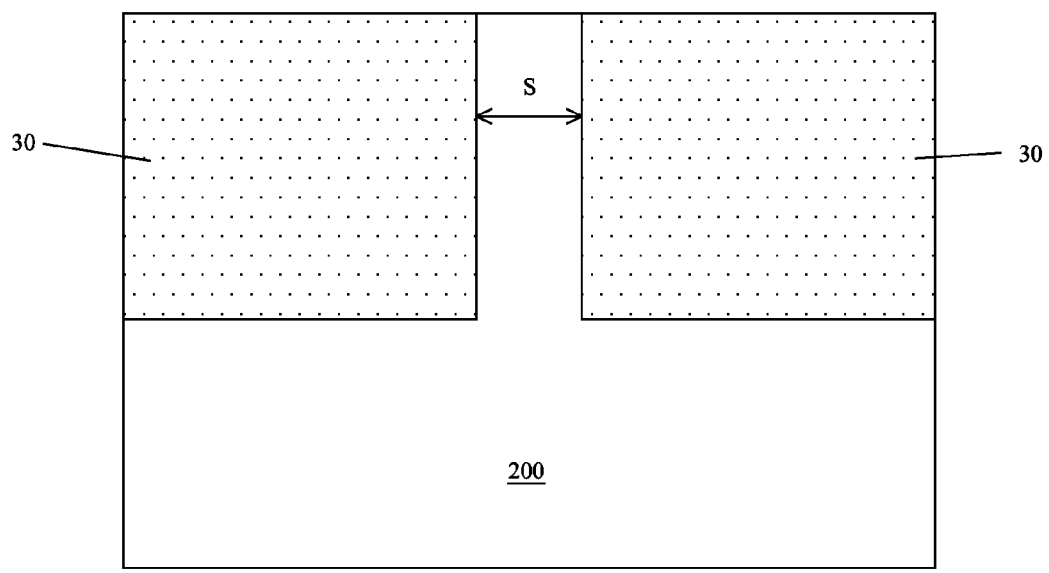
FIGS. 5 through 8 are cross-sectional views of intermediate stages in the manufacturing of the double-gate FinFET as shown in FIG. 3A.

FIGS. 5 through 8 illustrate cross-sectional views of intermediate stages in the manufacturing of the embodiment shown in FIG. 3A. Referring to FIG. 5, substrate 200 is provided. Substrate 200 may be a semiconductor formed of commonly used semiconductor materials such as silicon, germanium, GaAs, or the like. Insulation regions such as shallow trench isolation (STI) regions 30 are formed in substrate 200. The spacing S between neighboring STI regions 30 may be small, for example, less than about 50 nm, which spacing may be equal to or greater than thickness T1 of central fin 22 as shown in FIG. 3A.

Figure 6:
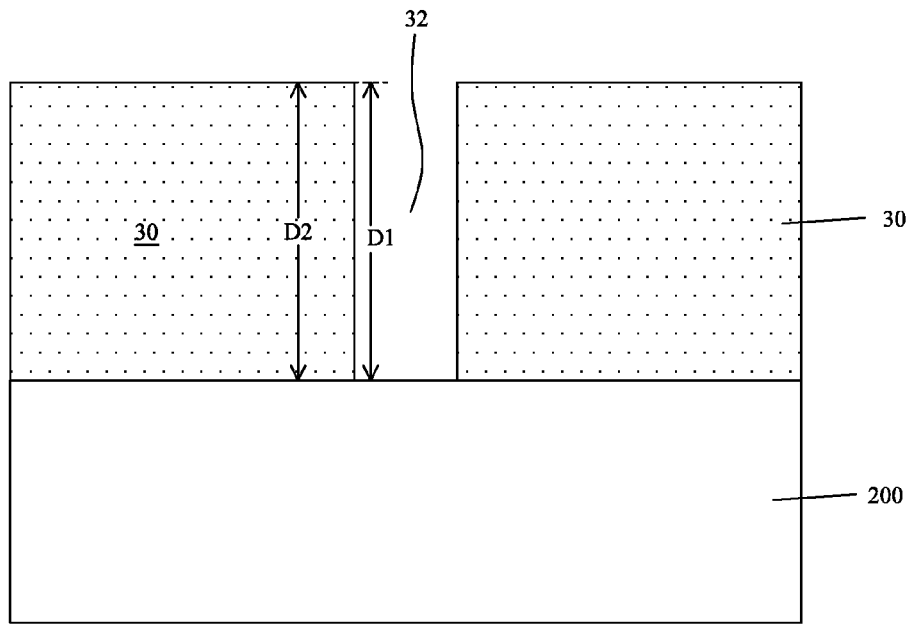
Figure 7:
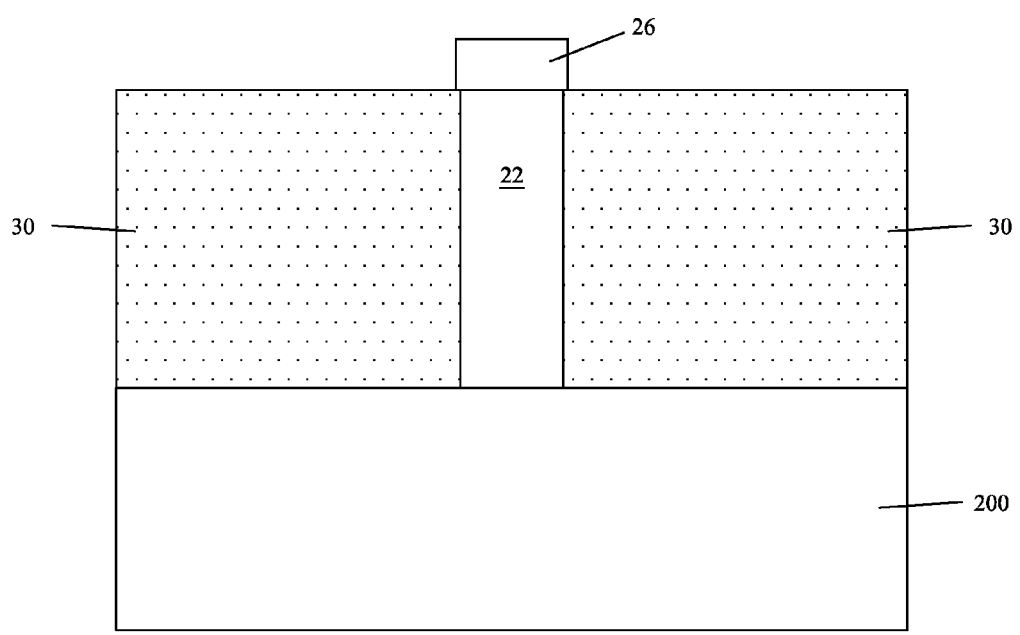

Next, as shown in FIG. 6, the portion of substrate 200 between opposing STI regions 30 is recessed to form recess 32. Recessing depth D1 may be substantially equal to or less than thickness D2 of STI regions 30. In FIG. 7, central fin 22 is epitaxially grown in recess 32. Hard mask 26 may be blanket formed and patterned to cover central fin 22, as also shown in FIG. 7.

In alternative embodiments, substrate 200 comprises compound semiconductor materials of group III and group V elements (referred to as III-V compound semiconductors hereinafter), and hence the formation of recess 32 and the epitaxial growth in recess 32 may be omitted. Accordingly, the portion of substrate 200 between STI regions 30 is central fin 22.

Figure 8:
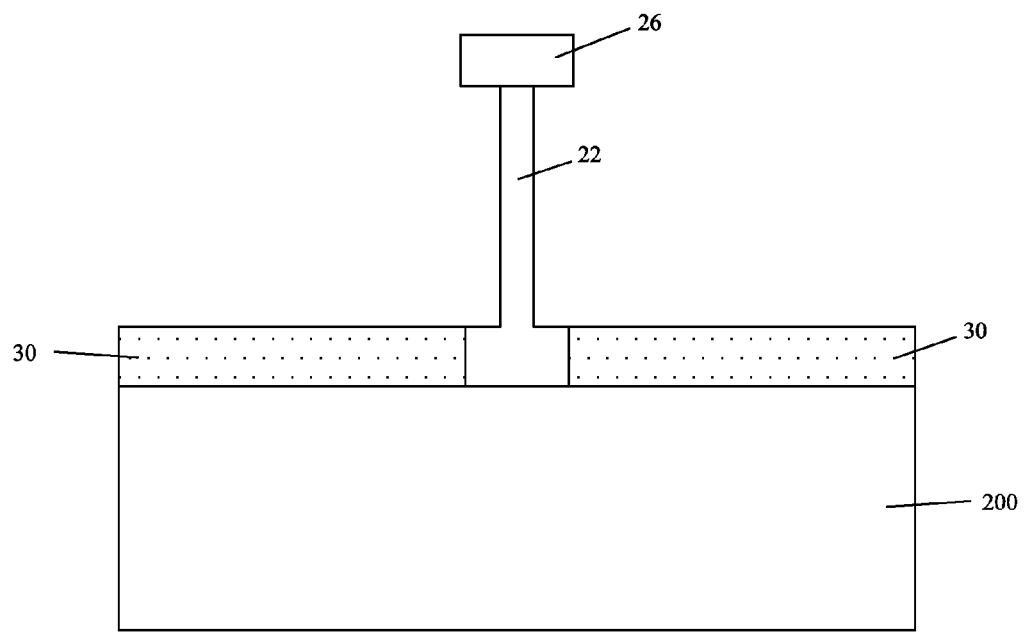

Next, as shown in FIG. 8, top portions of STI regions 30 are selectively etched, while bottom portions are left unetched. As a result, central fin 22 has a portion standing above the bottom portions of STI regions 30. After the formation of hard mask 26, an isotropic etch is performed to laterally recess central fin 22, so that hard mask 26 extends beyond edges of the remaining central fin 22. Next, as shown in FIG. 3A, semiconductor layer(s) 24 are epitaxially grown, followed by the formation of gate dielectric layer 12. In subsequent steps, gate electrode 8 is formed, resulting in the structure as shown in FIG. 3A.

Figure 9:
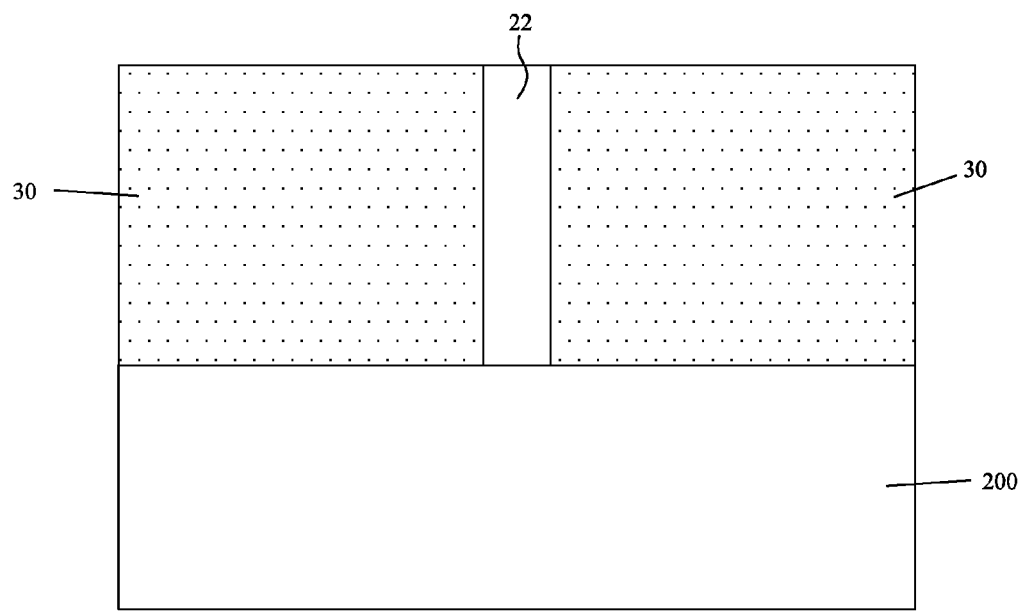
FIGS. 9 through 11 are cross-sectional views of intermediate stages in the manufacturing of the tri-gate FinFET as shown in FIG. 4.
Figure 10:
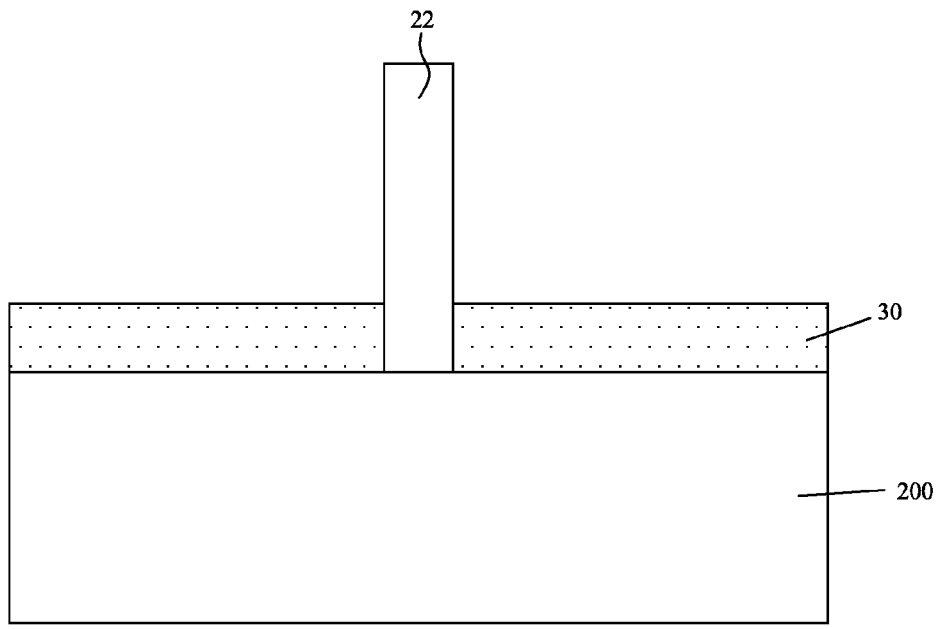
Figure 11:
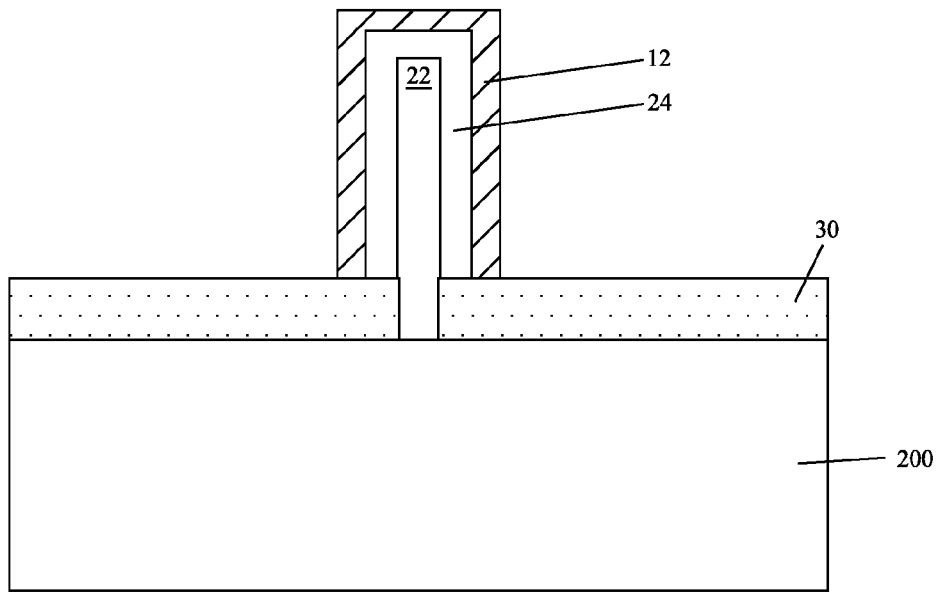

FIGS. 9 through 11 illustrate cross-sectional views of intermediate stages in the manufacturing of the embodiment shown in FIG. 4. The initial steps, which involve the formation of STI regions 30 in substrate 200 and optionally the recessing and epitaxial growth of central fin 22 are essentially the same as shown FIGS. 5-7. However, as shown in FIG. 9, no hard mask is formed. FIG. 10 illustrates the recessing of STI regions 30, so that central fin 22 has a portion protruding above the remaining portions of STI regions 30. Next, as shown in FIG. 11, semiconductor layer(s) 24 are epitaxially grown, followed by the formation of gate dielectric layer 12. In subsequent steps, gate electrode 8 is formed, resulting in the structure as shown in FIG. 4.

Figure 12A:
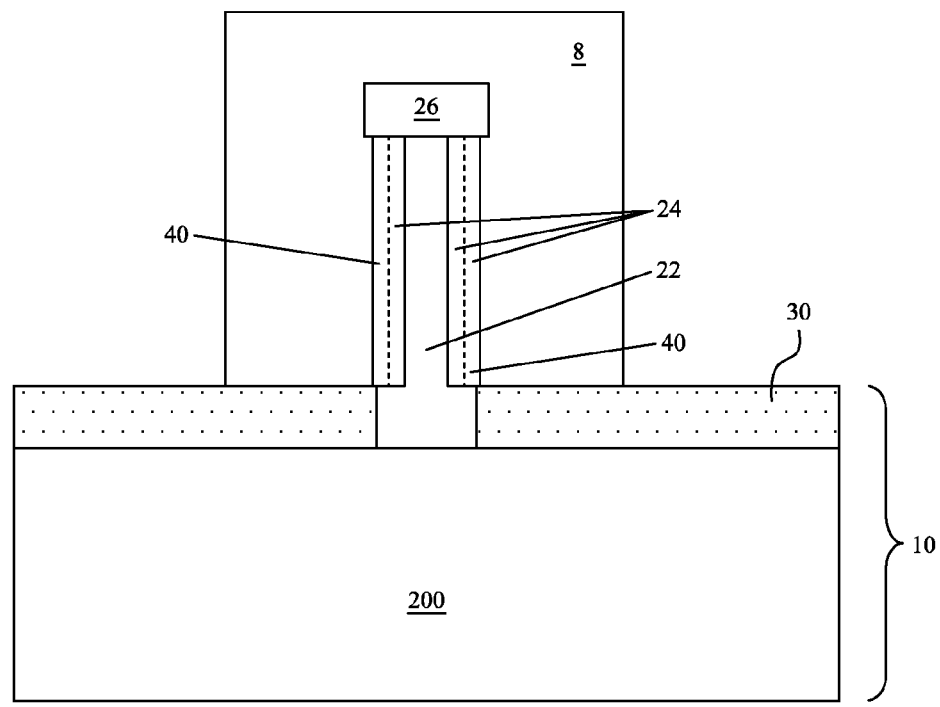
FIG. 12A illustrates a cross-sectional view of a double-gate FinFET, wherein no gate dielectric is formed.
Figure 12B:
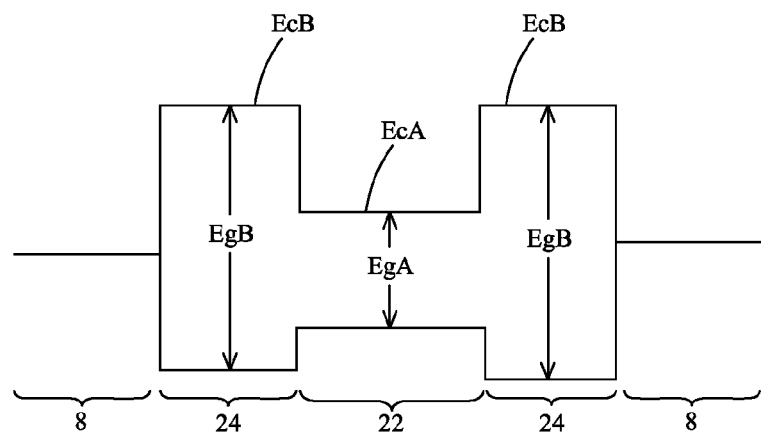
FIG. 12B illustrates a band diagram of the embodiment shown in FIG. 12A.

FIG. 12A illustrates yet another double-gate FinFET. This embodiment is similar to the embodiment as shown in FIG. 3A, except that no gate dielectric 12 is formed. In this embodiment, gate electrode 8 may be formed of metal, so that a Schottky barrier is formed between gate electrode 8 and semiconductor layer(s) 24, resulting in depletion layers 40, which act as gate dielectrics that electrically insulate gate electrode 8 from semiconductor layer(s) 24. A band diagram is illustrated in FIG. 12B. The materials of central fin 22 and semiconductor layer(s) 24 have been discussed in preceding paragraphs, and hence are not repeated herein. Again, bandgap EgA of central fin 22 may be less than bandgap EgB of semiconductor layer(s) 24. Also, conduction band EcA of central fin 22 may be less than conduction band EcB of semiconductor layer(s) 24.

Figure 13:
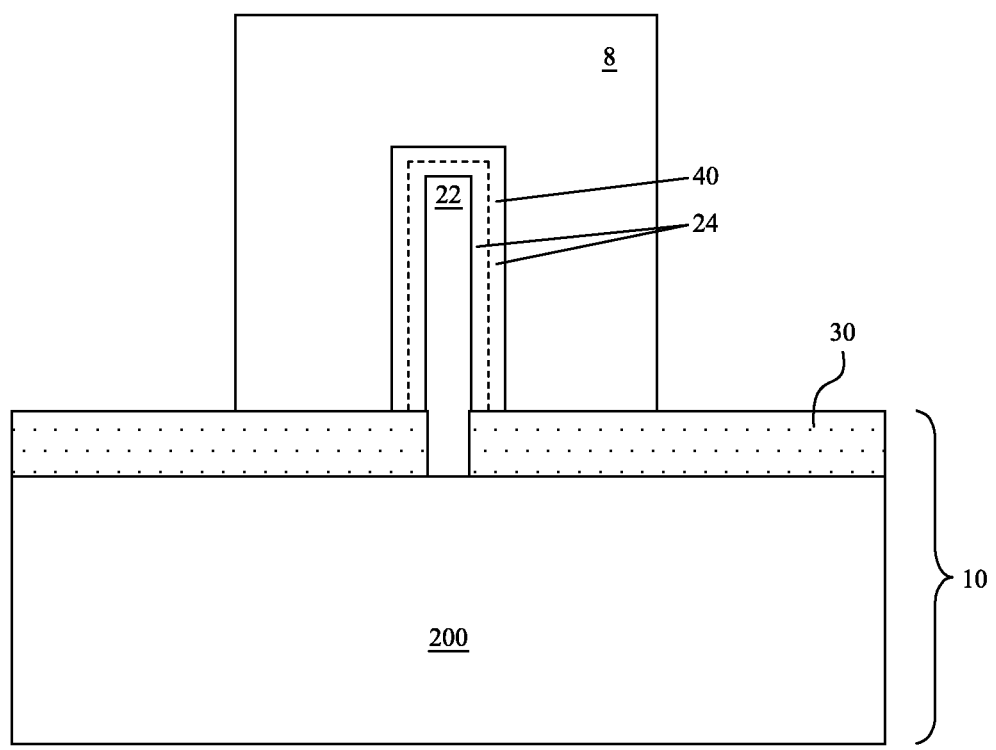
FIG. 13 illustrates a cross-sectional view of a tri-gate FinFET, wherein no gate dielectric is formed.

FIG. 13 illustrates yet another tri-gate FinFET embodiment. This embodiment is similar to the embodiment as shown in FIG. 4, except gate dielectric 12 as shown in FIG. 4 is replaced by depletion region 40 resulting from the Schottky barrier formed between gate electrode 8 and semiconductor layer(s) 24.

Figure 14:
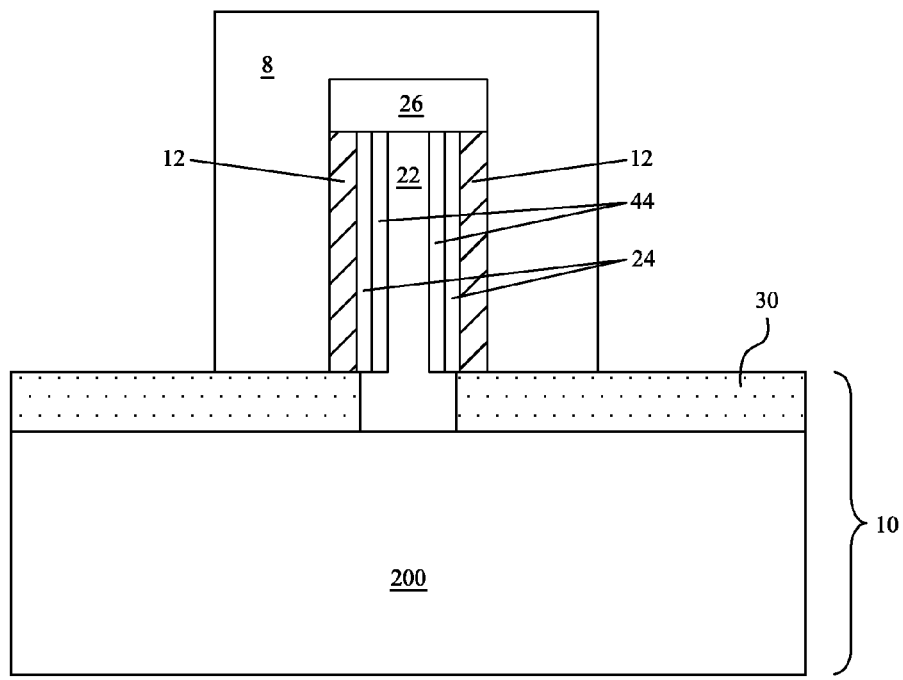
FIG. 14 illustrates a double-gate FinFET comprising three semiconductor materials in the fin.
Figure 15:
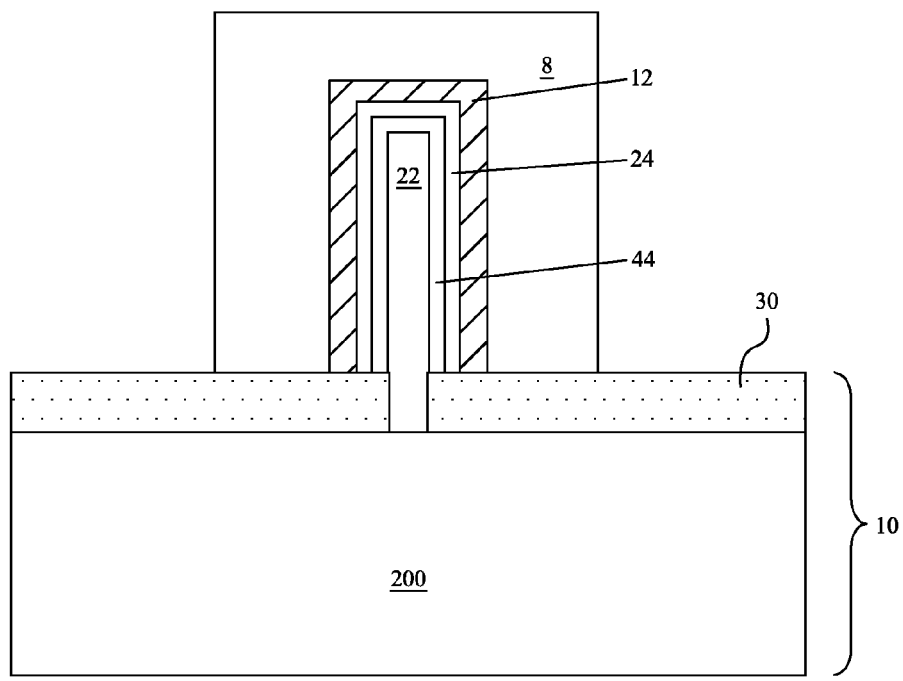
FIG. 15 illustrates a tri-gate FinFET comprising three semiconductor materials in the fin.

FIGS. 14 and 15 illustrate yet other multiple-gate FinFETs, wherein the quantum wells are formed of more than two semiconductor materials. For example, semiconductor layer(s) 44 may be formed between semiconductor layer(s) 24 and central fin 22. In an embodiment, the bandgap of semiconductor layer(s) 44 is higher than bandgap EgA of central fin 22, and lower than bandgap EgB of semiconductor layer(s) 24 (refer to FIGS. 3B and 12B). Also, the conduction band of semiconductor layer(s) 44 may be higher than conduction band EcA of central fin 22, and lower than conduction band EcB of semiconductor layer(s) 24 (refer to FIGS. 3B and 12B). In FIG. 14, hard mask 26 is formed, while no hard mask is formed in FIG. 15.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method comprising:
   forming a semiconductor fin comprising:
   laterally recessing an upper portion of a central fin to make a first lateral width of the upper portion of the semiconductor fin to be smaller than a second lateral width of a lower portion of the central fin, wherein the central fin comprises a first semiconductor material;
   forming a semiconductor layer comprising a first portion and a second portion on opposite sidewalls of the upper portion of the central fin wherein the semiconductor layer comprises a second semiconductor material different from the first semiconductor material, wherein the upper portion of the central fin and the first portion and the second portion of the semiconductor layer in combination form a semiconductor fin;
forming a gate electrode on sidewalls of the semiconductor fin; and
forming a source region and a drain region on opposite ends of the semiconductor fin, wherein each of the central fin and the semiconductor layer extends from the source region to the drain region.

2. The method of claim 1, wherein the upper portion of the central fin and the semiconductor layer form a quantum well.

3. The method of claim 1, wherein the forming the semiconductor layer comprises epitaxially growing the semiconductor layer on opposite sidewalls of the upper portion of the central fin.

4. The method of claim 1 further comprising forming the semiconductor fin comprising:
forming insulation regions on opposite sides of a middle semiconductor region;
recessing the insulation regions, so that the middle semiconductor region forms the central fin; and
covering the central fin with a hard mask, wherein the laterally recessing the upper portion of the central fin is performed with the hard mask covering the central fin.

5. The method of claim 4 further comprising:
after the forming the insulation regions, recessing a portion of a semiconductor substrate between the insulation regions to form a recess; and
epitaxially growing the middle semiconductor region from the recess, wherein the middle semiconductor region is formed of the first semiconductor material.

6. The method of claim 1, wherein the first semiconductor material has a bandgap lower than a bandgap of the second semiconductor material.

7. The method of claim 1, wherein the first semiconductor material has a conduction band lower than a conduction band of the second semiconductor material.

8. The method of claim 1, wherein the source region and the drain region are n-type regions.

9. The method of claim 1 further comprising forming a gate dielectric comprising a first portion on an outer sidewall of the first portion of the semiconductor layer, and a second portion on an outer sidewall of the second portion of the semiconductor layer.

10. The method of claim 1, wherein the gate electrode contacts the first portion and the second portion of the semiconductor layer.

11. A method comprising:
forming insulation regions;
recessing the insulation regions, so that a portion of a first semiconductor material between the insulation regions forms a central fin;
epitaxially growing a semiconductor layer comprising a first portion and a second portion on opposite sidewalls of the central fin, wherein the central fin has a first bandgap different from a second bandgap of the semiconductor layer;
forming a gate electrode, wherein the gate electrode extends on opposite sides of the central fin; and
forming a source region and a drain region on opposite ends of the central fin, wherein each of the central fin and the semiconductor layer extend from the source region to the drain region.

12. The method of claim 11, wherein the central fin and the semiconductor layer form a quantum well.

13. The method of claim 11, wherein first bandgap is lower than the second bandgap.

14. The method of claim 11 further comprising, between the forming the insulation regions and the recessing the insulation regions:
forming a recess between the insulation regions; and
epitaxially growing the central fin in the recess.

15. The method of claim 11 further comprising, after the recessing the insulation regions and before the epitaxially growing the semiconductor layer:
forming a hard mask over the central fin; and
laterally recessing the central fin.

16. A method comprising:
forming insulation regions in a semiconductor substrate;
recessing a portion of the semiconductor substrate between the insulation regions to form a recess;
epitaxially growing a first semiconductor material in the recess to form a central fin;
forming a hard mask to cover the central fin;
recessing the insulation regions to expose opposite sidewalls of the central fin; and
epitaxially growing a semiconductor layer comprising a first portion and a second portion on the opposite sidewalls of the central fin, wherein the semiconductor layer has a bandgap different from a bandgap of the central fin.

17. The method of claim 16 further comprising:
forming a gate electrode, wherein the gate electrode extends over a top surface and on opposite sides of the central fin; and
forming a source region and a drain region on opposite ends of the central fin, wherein each of the central fin and the semiconductor layer extend from the source region to the drain region.

18. The method of claim 16 further comprising, after the recessing the insulation regions to expose opposite sidewalls of the central fin, laterally recessing the central fin.

19. The method of claim 18, wherein after the laterally recessing the central fin, a top portion of the central fin is narrower than a bottom portion of the central fin.

20. The method of claim 19, wherein the top portion of the central fin has a bottom level with a top surface of the recessed insulation regions.

* * * * *